United States Patent
Shaw et al.

(10) Patent No.: US 8,116,144 B2
(45) Date of Patent: Feb. 14, 2012

(54) MEMORY MODULE HAVING A MEMORY DEVICE CONFIGURABLE TO DIFFERENT DATA PIN CONFIGURATIONS

(75) Inventors: Mark E. Shaw, Plano, TX (US); Christian Petersen, Allen, TX (US); Lidia Mihaela Warnes, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 509 days.

(21) Appl. No.: 12/251,805

(22) Filed: Oct. 15, 2008

(65) Prior Publication Data
US 2010/0091542 A1    Apr. 15, 2010

(51) Int. Cl.
*G11C 8/00* (2006.01)
(52) U.S. Cl. .............................. 365/189.03; 365/189.2
(58) Field of Classification Search .................. 365/233, 365/193, 185, 233.16, 63, 189.2, 189.3, 189.08; 711/103, 105
See application file for complete search history.

(56) References Cited

U.S. PATENT DOCUMENTS

| | | | |
|---|---|---|---|
| 5,568,651 A | 10/1996 | Medina et al. | |
| 6,092,146 A | 7/2000 | Dell et al. | |
| 6,298,426 B1 | 10/2001 | Ajanovic | |
| 6,459,651 B1 * | 10/2002 | Lee et al. | 365/233.13 |
| 6,632,705 B1 * | 10/2003 | Kang et al. | 438/107 |
| 7,420,818 B2 * | 9/2008 | Park et al. | 361/763 |
| 2007/0195613 A1 * | 8/2007 | Rajan et al. | 365/189.05 |

* cited by examiner

*Primary Examiner* — VanThu Nguyen
*Assistant Examiner* — Hien Nguyen

(57) ABSTRACT

A memory module includes a memory device having a plurality of data pins and conductive lines electrically connected to the plurality of data pins. The memory device is configurable, using at least one input to the memory device, to a data pin configuration selected from among a plurality of different data pin configurations. The plurality of different data pin configurations include a first data pin configuration that uses a first number of data pins of the memory device, and a second data pin configuration that uses a second, different number of data pins.

16 Claims, 4 Drawing Sheets

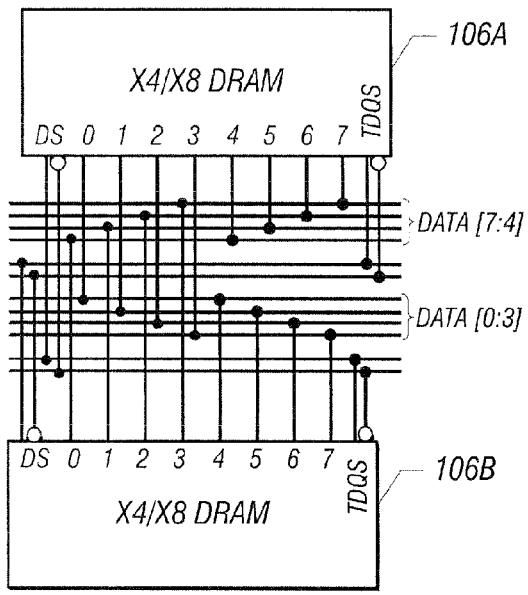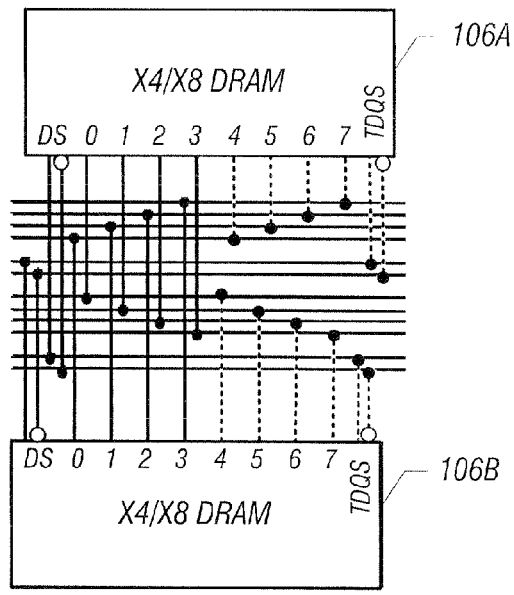
FIG. 6      FIG. 7
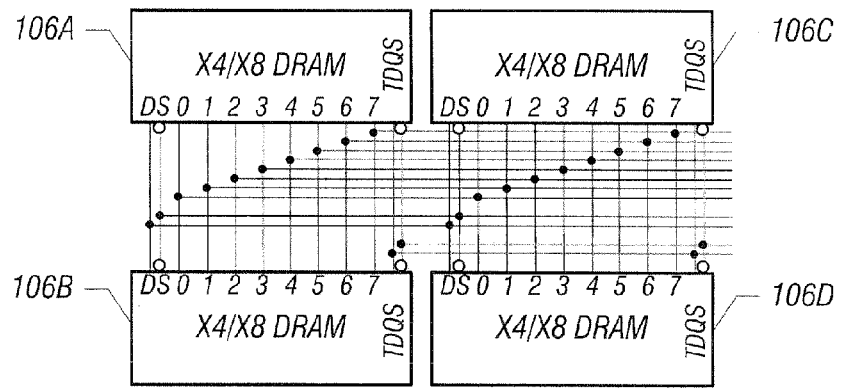
FIG. 8
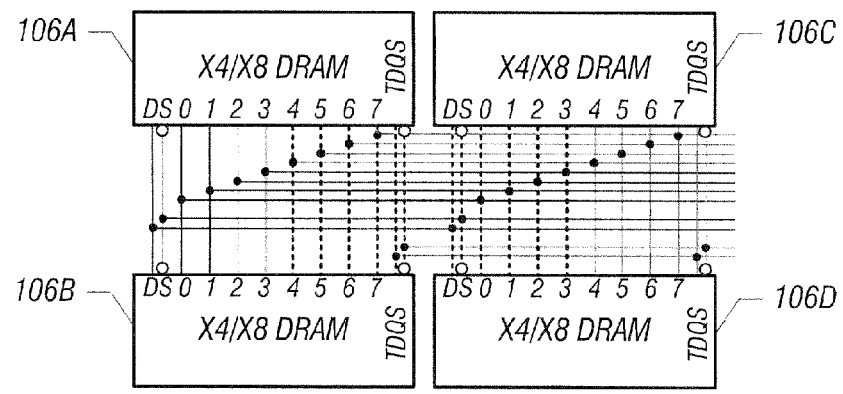
FIG. 9

MEMORY MODULE HAVING A MEMORY DEVICE CONFIGURABLE TO DIFFERENT DATA PIN CONFIGURATIONS

BACKGROUND

Electronic devices typically contain memory for storing data and software instructions. Such memory is typically provided between secondary storage (usually implemented with a disk-based storage device) and a central processing unit (CPU) of the electronic device. The memory can be implemented with dynamic random access memories (DRAMs). There are various different types of DRAMs, including synchronous DRAMs (SDRAMs) and double data rate (DDR) SDRAMs (defined by standards set by JEDEC). The original DDR SDRAM standard has been superseded by later established DDR2 and DDR3 standards. It is expected that a DDR4 standard will be promulgated by JEDEC in the future.

The memory used in an electronic device typically is in the form of a memory module having multiple DRAMs. In one example, the memory module is a dual in-line memory module (DIMM), which has a connector for insertion into a corresponding connector of the electronic device.

Conventionally, different types of memory modules (e.g., DIMMs) are employed depending on different data pin configurations. DRAMs are available in various densities (e.g., 512 megabit density, 1 gigabit density, etc.) and in various data pin configurations. One data pin configuration can be a x4 data pin configuration, where a DRAM employs four data pins (for inputting and outputting data). Other possible data pin configurations include x8 (where a DRAM employs eight data pins for inputting and outputting data), x16 (where a DRAM employs 16 data pins for inputting and outputting data), and so forth.

Typically, the data pin configuration of a DRAM is determined based on the metal option used by the DRAM manufacturer. A metal option refers to selection of a metal mask that is used to form a particular metal layer during manufacture of the DRAM. A first metal option (first metal layer) would cause the DRAM to be manufactured as a x4 DRAM, a second metal option (second metal layer) would cause the DRAM to be manufactured as a x8 DRAM, and so forth. Once manufactured to have a particular data pin configuration, the data pin configuration of the DRAM cannot be changed by a downstream customer (e.g., memory module manufacturer or other downstream customer).

As a result, different types of memory modules (e.g., different types of DIMMs) are typically used depending upon the data pin configuration of DRAMs included in the memory module. The different types of memory modules can have different arrangements of conductive line traces. For example, a memory module having x4 DRAMs would use a first arrangement of conductive line traces to interconnect the DRAMs, while a memory module having x8 DRAMs would use a second, different arrangement of conductive line traces to interconnect the DRAMs. Consequently, the memory module manufacturer would have to implement different manufacturing processes for making memory modules including DRAMs of different data pin configurations. This can lead to increased manufacturing costs, since different manufacturing processing lines would have to be implemented. Also, the memory module manufacturer may have to keep inventories of the different types of memory modules, which increases inventory costs.

BRIEF DESCRIPTION OF THE DRAWINGS

Some embodiments of the invention are described, by way of example, with respect to the following figures:

FIGS. 4-13 are schematic diagrams illustrating various different arrangements of memory devices on a memory module, in accordance with some embodiments.

DETAILED DESCRIPTION

Figure 1:
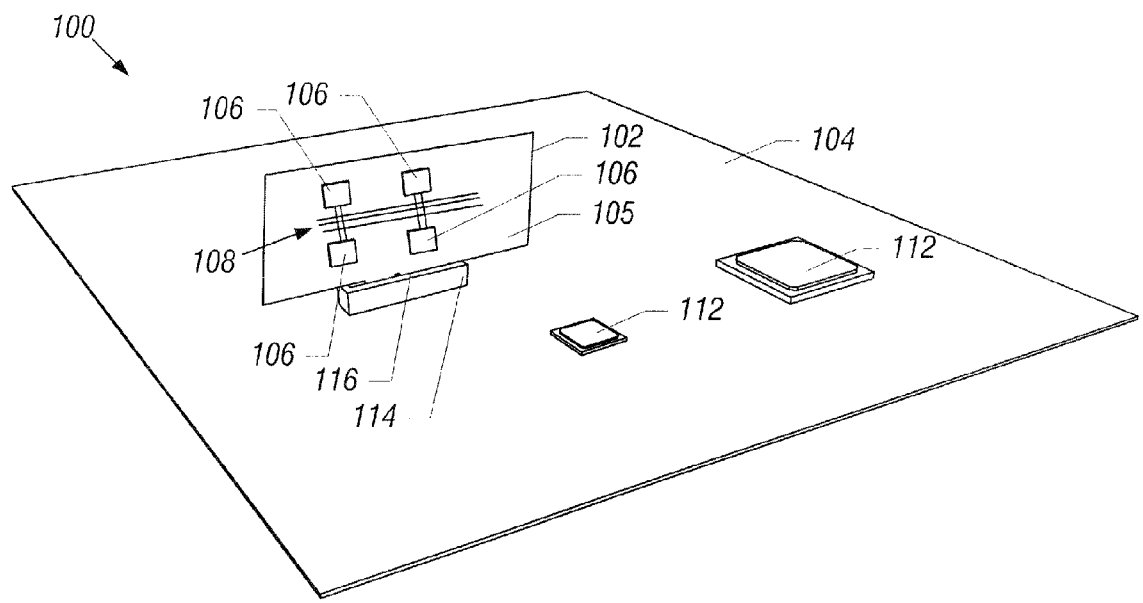
FIG. 1 is a schematic diagram of a portion of an electronic device including a memory module having memory devices that are configurable to different data pin configurations, in accordance with an embodiment.

FIG. 1 illustrates a portion of an exemplary electronic device 100. The portion illustrated includes a main circuit board 104 that has multiple components 112 (e.g., processors, input/output controllers, memory controllers, bridge devices, etc.) mounted on a surface of the circuit board 104. The circuit board 104 also includes a connector 114 that is for connecting to a corresponding connector 116 of a memory module 102.

The memory module 102 in one embodiment is a dual in-line memory module (DIMM). In other implementations, the memory module 102 can be another type of memory module. The memory module 102 includes memory devices 106 that are mounted to a first surface 105 of the memory module 102. The memory module 102 further has an opposite surface (on the other side of the memory module 102 that is not visible in the view of FIG. 1) on which additional memory devices can be mounted.

In some implementations, the memory devices 106 on the memory module 102 are dynamic random access memories (DRAMs). There are various different types of DRAMs, including synchronous DRAMs (SDRAMs), and the various different types of double data rate (DDR) SDRAMs, including DDR, DDR2, and DDR3, as established JEDEC. In the future, subsequent versions of DDR can be defined, including DDR4, and others.

In alternative embodiments, the memory devices 106 can be other types of memory devices, such as static random access memories (SRAMs), flash memories, and so forth.

At least some of the memory devices 106 on the memory module 102 are selectively configurable among multiple different data pin configurations. The multiple data pin configurations include at least a first data pin configuration that uses a first number of data pins (for inputting and outputting data), and a second data pin configuration that uses a second, different number of data pins (for inputting and outputting data). Data input into a memory device is stored in memory cells of the memory device. In one example, the first data pin configuration can be a x4 configuration (in which four data pins are used), and the second data pin configuration can be a x8 configuration (in which eight data pins of the memory device are used). Other possible data pin configurations include a x1 data pin configuration, a x16 data pin configuration, or other data pin configuration.

The data pins of the memory devices 106 are interconnected by conductive lines 108 on the memory module 102. The conductive lines 108 can be implemented as conductive traces on the memory module 102.

The selective configuration of the memory devices 106 among the different data pin configurations can be performed after the memory devices have been manufactured. A memory device 106 is configurable among the multiple data pin configurations according to at least one input provided to each memory device. The at least one input can be in the form of configuration information that can be written to the memory device 106, such as for programming a mode register 202 (depicted in FIG. 2) of the memory device. In this example, the mode register 202 of the memory device 106 is used for selecting the mode of the memory device 106. The modes that can be selected using the mode register 202 include the data pin configuration of the memory device 106. The mode register 202 programmed to a first value will indicate a first data pin configuration, the mode register being programmed to a second value will indicate a second, different data pin configuration, and so forth.

Alternatively, instead of writing configuration information into the memory device 106 for selecting the data pin configuration, one or more configuration pins (e.g., pin 204 in FIG. 2) can be provided on the memory device 106, with the one or more configuration pins tied to different voltage values for setting different data pin configurations. For example, if a single configuration pin (204) is used, then the configuration pin can be tied high (connected to a high voltage) to select a first data pin configuration, and tied low (connected to a low voltage) to select a second, different data pin configuration.

Figure 2:
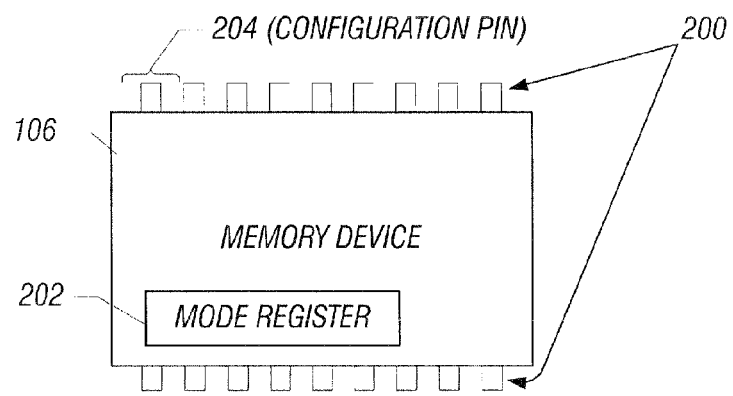
FIG. 2 is a schematic diagram of a memory device that is configurable to different data pin configurations, according to an embodiment.

As further depicted in FIG. 2, the memory device 106 includes pins 200. The pins 200 include data pins (for inputting and outputting data), control pins, address pins, and other pins. In one example, the memory device 106 can include 8 data pins. This enables the memory device 106 to be selectively configured between a x8 data pin configuration and a x4 data pin configuration, for example. In the x4 data pin configuration, four of the data pins of the memory device 106 would not be used.

However, it is noted that the conductive lines 108 (FIG. 1) on the memory module 102 do not have to be changed even though the memory devices of the memory module 102 are switched between the x4 and x8 data pin configurations. In the x8 configuration, all the conductive lines 108 would be used; however, in the x4 configuration, half of the conductive lines 108 would not be used.

Figure 3A:
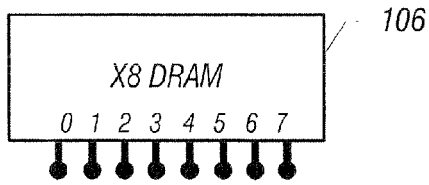
FIGS. 3A-3C illustrate three different modes of a memory device, wherein the different modes correspond to different data pin configurations, in accordance with an embodiment.
Figure 3B:
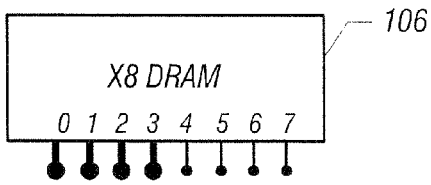
Figure 3C:
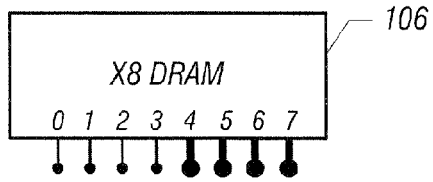

FIGS. 3A-3C illustrate three different modes of an exemplary DRAM. FIG. 3A shows a x8 mode, in which all eight data pins of the DRAM are used. FIG. 3B illustrates a first type of x4 data pin configuration (referred to "x4 mode 0"), in which data pins 0-3 of the DRAM are used (but data pins 4-7 are unused). FIG. 3C shows a second x4 data pin configuration (referred to as the "x4 mode 1"), in which data pins 4-7 of the DRAM are used (but data pins 0-3 are unused). Although three modes are depicted in the example of FIGS. 3A-3C, it is noted that an alternative implementation can involve just two modes, e.g., x8 mode and x4 mode 0, or x8 mode and x4 mode 1.

Figure 4:
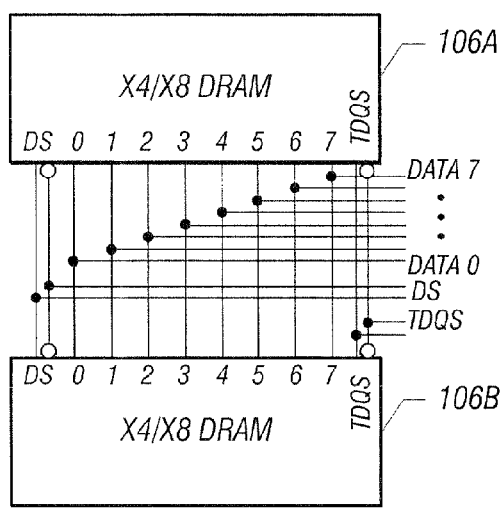

A DRAM that is configurable between the x4 date pin configuration and the x8 data pin configuration is referred to as a x4/x8 DRAM. FIG. 4 shows two DRAMs 106A and 106B (mounted on a memory module) configured in the x8 mode, in which all eight data pins D0-D7 of each DRAM are used. In the example of FIG. 4, the D0 data pins of DRAMs 106A and 106B are connected together by a corresponding data line (Data0). Similarly, the D1 data pins of the DRAMs 106A and 106B are connected together by a corresponding data line (Data1), the D2 data pins of the DRAMs 106A and 106B are connected together by a corresponding data line, and so forth. One or the other of the DRAMs 106A and 106B can be enabled at any given time to drive the eight data lines Data0-Data7.

Moreover, in the exemplary implementation, each DRAM also includes two data strobe (DS, TDQS) control pins. The DS control pins of the DRAMs 106A, 106B are connected to a DS control line, which controls data pins 0-3, and the data strobe TDQS pins of the DRAMs 106A, 106B are connected to a TDQS control line, which controls data pins 4-7. A data strobe is a control signal used to indicate when data (read data or write data) is valid. In the depicted example, each of the DS and TDQS control lines is depicted as being a pair of signal traces, since the example assures the DS and TDQS strobes are differential signals.

The data lines Data0-Data7, data strobe lines DS and TDQS, and other address and control lines together make up the conductive lines 108 of FIG. 1, in one example. The exemplary arrangement of FIG. 4 is an example of a 2-rank arrangement in which each data line (Data0-Data7) is connected to two DRAMs.

Figure 5:
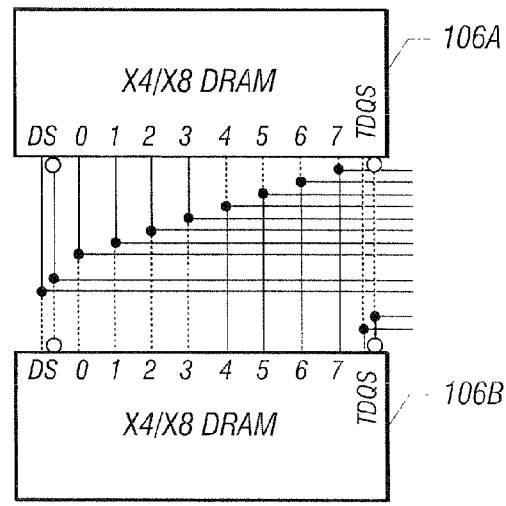

In another example, as depicted in FIG. 5, a 1-rank arrangement can be employed. In FIG. 5, the DRAMs 106A and 106B have each been configured to be in a x4 data pin configuration. The DRAM 106A is set to x4 mode 0 (as depicted in FIG. 3B), whereas the DRAM 106B is set to x4 mode 1 (as depicted in FIG. 3C). In x4 mode 0, the DRAM 106A uses data pins 0-3, while in x4 mode 1, the DRAM 106B uses data pins 4-7. Note that dashed lines indicate connections that are unused by the corresponding DRAMs 106A, 106B (even though those lines are physically present, those lines are not actually used by the corresponding DRAMs due to the respective x4 data pin configuration).

FIGS. 4 and 5 illustrate examples in which all three modes as depicted in FIGS. 3A-3C are used. FIG. 4 shows both DRAMs 106A and 106B set to the x8 mode, while FIG. 5 shows DRAM 106A set to the x4 mode 0, and DRAM 106B set to x4 mode 1.

The DRAMs 106A, 106B are selectable between the FIG. 4 and FIG. 5 arrangements using either the mode register 202 or configuration pin(s) 204 of FIG. 2. For example, the mode register 202 can be programmed by an electronic device to select the target data pin configurations (x8 mode, x4 mode 0, x4 mode 1) for the DRAMs 106A, 106B. Alternatively, the memory module manufacturer can tie the configuration pin(s) 204 to respective values to select the target data pin configurations.

In a different embodiment, instead of using three modes, two modes are supported, as illustrated in FIGS. 6 and 7. In the examples of FIGS. 6 and 7, the two data pin configuration modes used are the x8 mode and x4 mode 0. FIG. 6 shows DRAMs 106A and 106B configured according to the x8 mode (in which all eight data pins of both DRAMs 106A and 106B) are used. Data pins 7, 6, 5, and 4 of DRAM 106A are connected to data lines Data7, Data6, Data5, and Data4, respectively. Also, data pins 3, 2, 1, and 0 of DRAM 106B are connected to data lines Data7, Data6, Data5, and Data4, respectively.

Similarly, data pins 0, 1, 2, and 3 of DRAM 106A are connected to data lines Data0, Data1, Data2, and Data3, respectively, whereas data pins 4, 5, 6, and 7 are connected to data lines Data0, Data1, Data2, and Data3, respectively.

The arrangement of FIG. 6 is a 2-rank arrangement. A 1-rank arrangement is depicted in FIG. 7, in which both DRAMs 106A and 106B are configured in x4 mode 0, which means data pins 0-3 of each of the DRAMs 106A and 106B are used, whereas data pins 4-7 are not used. Note also that the data strobe TDQS for data pins 4-7 of each DRAM 106A, 106B is also not used.

FIG. 8 shows a 4-rank arrangement in which four DRAMs 106A, 106B, 106C, and 106D are connected to the same set of data lines. The DRAMs 106A-106D of FIG. 8 are each set in the x8 mode.

FIG. 9 shows a 2-rank arrangement (two DRAMs connected to each data line). In FIG. 9, the DRAMs 106A and 106B are each set in x4 mode 0, whereas the DRAMs 106C and 106D are set in x4 mode 1. Thus, data pins 0-3 of DRAMs 106A and 106B are used, while data pins 4-7 of DRAMs 106C and 106D are used. Data pins 4-7 of DRAM 106A are not used (indicated by the dashed lines), and data pins 0-3 of DRAMs 106C and 106D are not used (indicated by the dashed lines).

Figure 10:
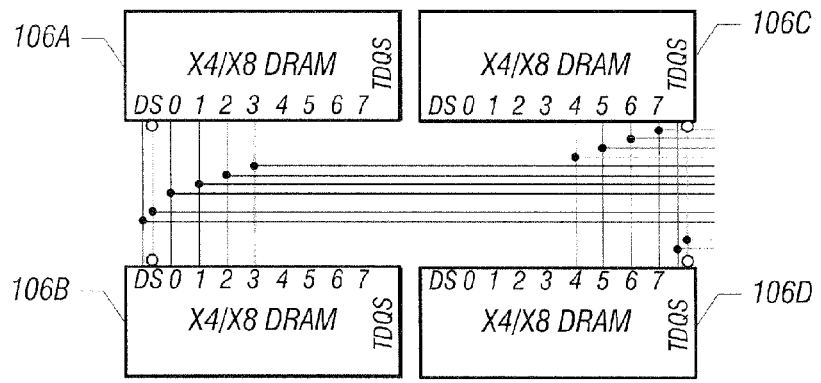

It is noted that the presence of data line connections to unused data pins of the DRAMs 106A-106D of FIG. 9 adds loading to the data lines (in the form of increased capacitance seen by an active DRAM on a given data line). The increased loading can cause data speeds to be reduced for the arrangement of FIG. 9. To address the data speed issue, the arrangement of FIG. 10 can be used. In FIG. 10, DRAMs 106A, 106B, 106C, and 106D are configured in the same way as the same DRAMs in FIG. 9, except in FIG. 10, data line connections to unused pins of the DRAMs are not provided. This reduces loading on the data lines (and on the data strobes), which can enhance data speeds.

Figure 11:
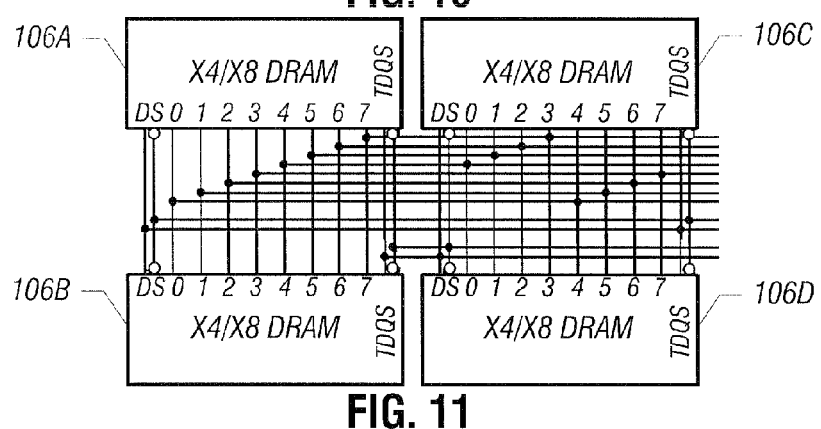
Figure 12:
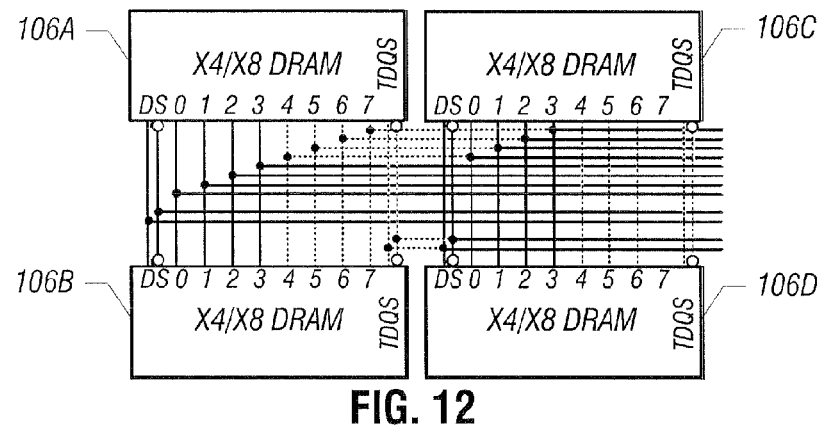
Figure 13:
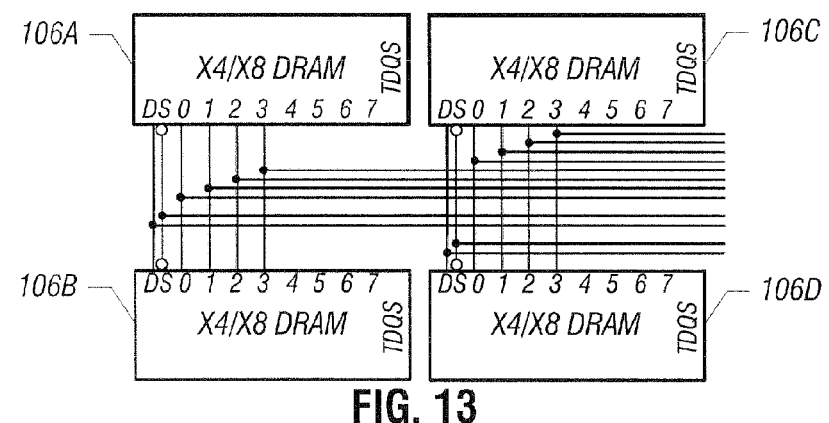

The examples of FIGS. 8-10 assume that all three data pin configuration modes are available. In a different example, just two data pin configuration modes are provided, which is depicted in FIGS. 11-13. In FIG. 11, the x8 mode is set for each of the DRAMs 106A, 106B, 106C, and 106D. In FIG. 12, each of the DRAMs 106A, 106B, 106C, and 106D is set in x4 mode 0. Similarly, in FIG. 13, each of the DRAMs 106A, 106B, 106C, and 106D is set in x4 mode 0.

In other embodiments, similar concepts can be applied to other memory modules with different numbers of DRAMs.

By employing techniques and mechanisms according to some embodiments, flexibility is enhanced for memory module makers or for other downstream customers that use memory devices. For example, a customer can choose between an x4 mode or an x8 mode of operation for a memory module. The x4 mode of operation has better error correction and higher capacity than the x8 mode of operation. However, the x8 mode of operation consumes lower power.

In addition, by providing selectivity between different data pin configurations, just one package type can be provided for DRAMs. For example, a DRAM manufacturer does not have to provide both x4 and x8 package types; rather, a DRAM manufacturer can provide just the x8 DRAM package type, and allow downstream customers to select between the x8 data pin configuration and x4 data pin configuration.

Also, since a common memory module can be used with either x4 or x8 DRAMs, a memory module maker can use just one type of memory module, rather than two different types for the different data pin configurations of DRAMs.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A memory module comprising:
a memory device having a plurality of data pins; and
conductive lines electrically connected to the plurality of data pins,
wherein the memory device is configurable, using at least one input to the memory device, to a data pin configuration selected from among a plurality of different data pin configurations, the plurality of different data pin configurations including a first data pin configuration that uses a first number of data pins of the memory device, and a second data pin configuration that uses a second, different number of data pins.

2. The memory module of claim 1, wherein the configurable memory device enables a single type of memory module to support different memory device data pin configurations.

3. The memory module of claim 1, further comprising at least another memory device having a plurality of data pins electrically connected to the conductive lines, wherein the another memory device is also configurable, using at least one input to the another memory device, to a data pin configuration selected from among the plurality of different data pin configurations.

4. The memory module of claim 1, wherein the at least one input comprises at least one input pin to the memory device that is tied to different voltage levels to specify different data pin configurations for the memory device.

5. The memory module of claim 1, wherein the memory device comprises a mode register, and wherein the at least one input to the memory device allows programming of the mode register to select the data pin configuration from among the plurality of different data pin configurations for the memory device.

6. The memory module of claim 1, further comprising at least another memory device having a plurality of data pins connected to the conductive lines, wherein the memory devices have a 2-rank arrangement.

7. The memory module of claim 1, further comprising at least another memory device having a plurality of data pins connected to the conductive lines, wherein the memory devices have a 4-rank arrangement.

8. The memory module of claim 1, further comprising at least another memory device having a plurality of data pins connected to the conductive lines, wherein the memory devices have a 1-rank arrangement.

9. The memory module of claim 1, wherein the memory device has at least two data strobe pins, a first of the data strobe pins to control a first subset of the plurality of data pins, and a second of the data strobe pins to control a second subset of the plurality of data pins.

10. The memory module of claim 1, wherein the second number of data pins is less than the first number of data pins, and wherein the second data pin configuration uses a first group of the second number of data pins, and the plurality of different data pin configurations further include a third data pin configuration that uses a second, different group of the second number of data pins.

11. An electronic device comprising:
a circuit board having a connector; and
a memory module connected to the connector, wherein the memory module comprises:
memory devices each having a plurality of data pins; and
conductive lines electrically connected to the plurality of data pins of the memory devices,
wherein each memory device is configurable, using at least one input to the memory device, to a data pin configuration selected from among a plurality of different data pin configurations that employ different numbers of data pins of each memory device, wherein a first of the plurality of different data pin configurations uses a first number of data pins of the memory devices, and a second of the plurality of different data pin configurations uses a second, smaller number of data pins of the memory devices.

12. The electronic device of claim 11, wherein the plurality of different data pin configurations further include a third data pin configuration that uses a different subset of the second number of data pins.

13. A method, comprising:
providing a memory device having a plurality of data pins on a memory module;
providing conductive lines on the memory module that are electrically connected to the plurality of data pins; and
selectively configuring the memory device to a selected one of multiple different data pin configurations, wherein the multiple data pin configurations include a first data pin configuration that uses a first number of data pins of the memory device, and a second data pin configuration uses a second, different number of data pins.

14. The method of claim 13, wherein selectively configuring the memory device comprises programming a mode register of the memory device.

15. The method of claim 14, wherein programming the mode register is performed through at least one input of the memory device.

16. The method of claim 13, wherein selectively configuring the memory device comprises tying at least one input pin of the memory device to a voltage value.

* * * * *